United States Patent

[11] 3,566,166

[72] Inventor Manfred Borner
Ulm Danube, Germany

[21] Appl. No. 732,398
[22] Filed May 27, 1968
[45] Patented Feb. 23, 1971
[73] Assignee Telefunken Patenverwertungsgesellschaft m.b.H.
Danube, Germany
[32] Priority May 31, 1967
[33] Germany
[31] T33,983

[54] MECHANICAL RESONATOR FOR USE IN AN INTEGRATED SEMICONDUCTOR CIRCUIT
9 Claims, 9 Drawing Figs.

[52] U.S. Cl. 310/8.2, 310/8.5, 310/9.1, 310/9.4, 310/9.7, 317/234
[51] Int. Cl. H01v 7/00, H04r 17/00
[50] Field of Search 317/234, 235; 310/8—9.4

[56] References Cited

UNITED STATES PATENTS

| | | | |
|---|---|---|---|
| 3,336,541 | 8/1967 | Ura | 333/72 |
| 3,358,249 | 12/1967 | Kawakami | 333/71 |
| 3,209,178 | 9/1965 | Koneval | 310/9.1 |
| 3,294,988 | 12/1966 | Packard | 310/8.0 |
| 3,071,736 | 1/1963 | Vonbun | 310/8.9 |
| 3,395,265 | 7/1968 | Weir | 310/8.9 |
| 3,414,832 | 12/1968 | Newell | 317/235 |
| 3,437,849 | 4/1969 | Treatch | 310/8.9 |
| 3,453,711 | 7/1969 | Miller | 310/8.0 |
| 3,411,048 | 11/1968 | Lepselter | 317/234 |
| 3,446,975 | 5/1969 | Adler | 310/8.3 |

*Primary Examiner*—D. X. Sliney
*Assistant Examiner*—Mark O. Budd
*Attorney*—Spencer and Kaye

ABSTRACT: A mechanical resonator for use in an integrated semiconductor circuit. Such resonator is formed by that portion of a circuit element which extends freely beyond a circuit block to which the circuit element is firmly connected. A further aspect of the invention relates to the method of producing such a resonator.

PATENTED FEB 23 1971 3,566,166

SHEET 1 OF 2

INVENTOR

Manfred Börner

BY Spencer & Kaye

ATTORNEYS

INVENTOR
Manfred Börner
BY Spencer & Kaye
ATTORNEYS

MECHANICAL RESONATOR FOR USE IN AN INTEGRATED SEMICONDUCTOR CIRCUIT

BACKGROUND OF THE INVENTION

The present invention relates to mechanical resonators for use in integrated semiconductor circuits and to a method for producing the same.

The problem of miniaturizing selector means still poses considerable difficulties in the art of integrated semiconductor circuits. In particular, it has heretofore not been possible to produce resonant integrated circuits of very high quality which at the same time conform to the dimensional and productional requirements of the art.

The present invention is based on the so-called "beam-lead" technique for the production of integrated semiconductor circuits. According to this technique, the individual active and passive circuit components of the integrated circuit are first applied to a common semiconductor crystal. After metallic connecting leads have been applied, preferably by a vapor-deposition process, but which can also be done electrolytically, the crystal or baseplate is subdivided into individual circuit blocks by a photoetching process. The individual circuit blocks thus formed are then connected to each other solely by the above-mentioned metallic connecting leads.

SUMMARY OF THE INVENTION

It is an object of the present invention to provide a relatively simple mechanical resonance element for use in integrated semiconductor circuits.

It is also an object of the present invention to provide electromechanical oscillator circuits and filters, by means of mechanical resonance elements, for use in integrated semiconductor circuits.

In brief, the present invention provides mechanical resonators for use in integrated semiconductor circuits which comprise that portion of a circuit element which extends beyond the circuit block to which the circuit element is firmly connected.

Moreover, the present invention describes a method for producing mechanical resonators for use in integrated semiconductor circuits based on the "beam-lead" technique. According to such method, the circuit elements which are to serve as resonators and/or connecting leads for the semiconductor circuit block are preferably formed simultaneously by vapor-deposition. Subsequently, it is provided that at least the semiconductor material, which contains the circuit elements to serve as resonators, will be partially removed.

DETAILED DESCRIPTION OF THE PREFERRED METHOD AND EMBODIMENTS

Figure 1:
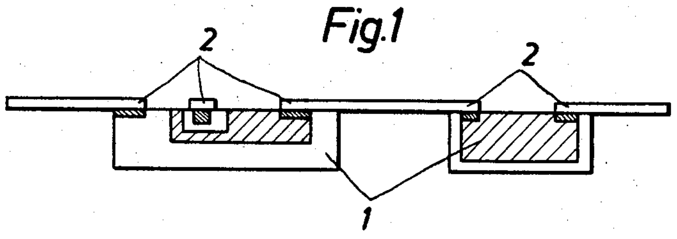
FIG. 1 is a cross-sectional view of adjacent circuit blocks having mechanical resonators according to the invention.

Referring to FIG. 1, there is shown a cross section taken through adjacent circuit blocks 1 containing an integrated semiconductor circuit. The blocks 1 are produced by a number of successive operations including: masking, etching and vapor-depositing, whereby zones of various degrees of doping are diffused into the original body, or baseplate, of semiconductor material present. These zones, shown in FIG. 1 as hatched or shaded portions, will later form the active as well as the passive components of the integrated circuit. For instance, in further process steps resistance materials or metallic substances can be applied to the semiconductor material, thus creating passive circuit components.

Subsequent to producing the individual circuit components in or on the basic semiconductor material, the circuit elements 2 are applied by conventional vapor-deposition process to form connecting leads, between the individual circuit components, and/or contact leads for subsequent use as contact members. Only after these various production steps take place are the circuit blocks 1, which thus far have been disposed on a continuous baseplate of semiconductor material, separated by an etching process.

During the etching process, the circuit elements 2 are also created. Each element 2 freely extends beyond the semiconductor material of circuit block 1 to which one of its ends is firmly connected. It also has been found advantageous to connect one end of the element 2 to one circuit block 1 and the other end of element 2 to an adjacent circuit block 1. By this arrangement, the free portion of the circuit element 2, interposed between the adjacent surface blocks 1, is free to oscillate or resonate therebetween.

The oscillatory circuit element 2 can be provided specifically for use as a simple resonator only, or, as shown in FIG. 1, it can also be used as a connecting lead.

Figure 2:
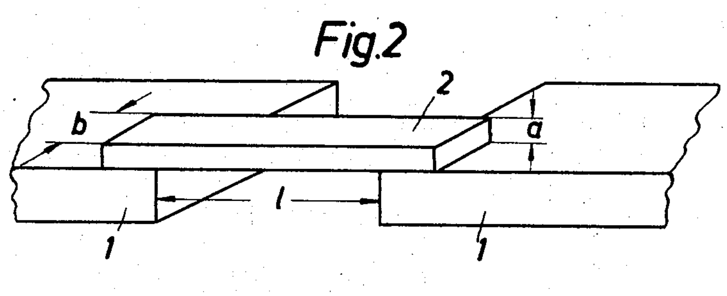
FIG. 2 is a perspective view of two circuit blocks connected by a mechanical resonator according to the present invention.

Referring to FIG. 2, a structure is shown which is produced in the manner described above, i.e., a transverse beam having its respective ends firmly conveyed to adjacent circuit blocks 1. The following represents the formula for the natural frequency of such beam:

$$f_0=\frac{m_i^2}{2\cdot\sqrt{12}}\cdot\frac{a}{l^2}\cdot\sqrt{\frac{E}{\delta}}$$

where $m_i$ represents the Eigen values of the consecutive flexural vibration or oscillation mode; $a$ represents the thickness of the beam: $l$ represents the free portion of the beam which extends between adjacent circuit blocks 1; $E$ represents the modulus of elasticity for the particular material which makes up the beam and $\rho$ indicates the density of such material.

For instance, considering gold as an example, the following are the values for the various functions of the formula discussed above: $E/\rho = 5\times10^6$ mm./sec., $m_i = 4.736$; 7.853; etc. Where there is a length of the beam $l$ approximately equal to 0.5 mm., the thickness $a$ at a frequency of 500 kHz. becomes about 25 $\mu$ for the lowest Eigen value. This value corresponds approximately to the normal thickness of connecting leads which are used in integrated semiconductor circuits. The width $b$ of the beam can be selected within wide limits, as desired; however, it should be less than the length $l$ of the beam. For instance, in the above example, the width $b$ could be about 0.2 to 0.3 mm.

Figure 3:
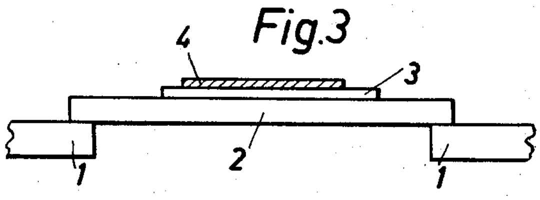
FIG. 3 is a side view of a portion of an integrated semiconductor circuit arrangement having a mechanical resonator according to the present invention.

Referring to FIG. 3, the free portion of circuit element 2 is used as a transducer-resonator. Such a transducer-resonator is formed by vapor-deposition of a piezoelectric layer 3 onto the free portion of the circuit element 2 which is a resonator. An excitation electrode 4 is then vapor-deposited onto the layer 3. The element 2 itself forms the second excitation electrode.

Figure 4:
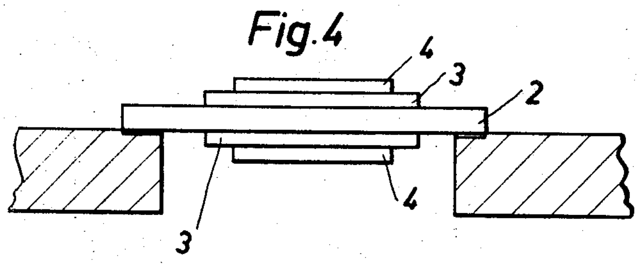
FIG. 4 is a side view of a portion of an integrated semiconductor circuit showing another arrangement having a mechanical resonator according to the present invention.

Referring to FIG. 4, if it is desired to build a single resonator or a single-circuit filter, respectively, as shown therein, both sides of the free portion or resonator of circuit element 2 must be supplied with a layer 3 of piezoelectric or electrostrictive material and also with an excitation electrode 4.

One side of such a transducer-resonator serves as an input transducer while the other side serves as an output transducer. The input transducer causes the elongated layer 3 to vibrate, preferably at the natural frequency of resonator 2 by piezoeffect. The output transducer receives the resulting mechanical vibrations and transforms them once more into electrical oscillations. Thus the vibrating free portion of circuit element 2 performs the function of an electromechanical filter.

Figure 5:
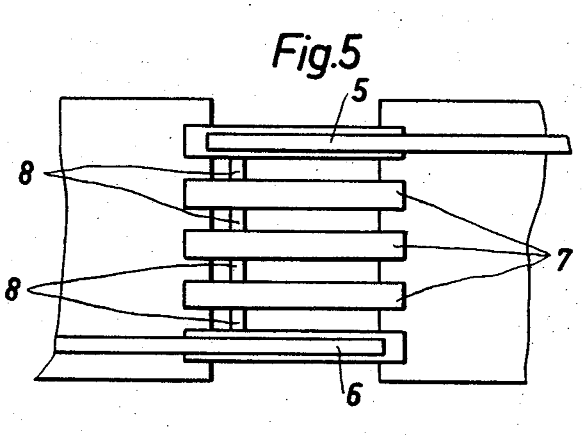
FIG. 5 is a plan view of a portion of an integrated semiconductor circuit showing yet another arrangement having a mechanical resonator according to the present invention.

Referring to FIG. 5, as shown therein, a plurality of resonators 7 are provided in addition to a resonator 5 which serves as an input transducer and a resonator 6 which serves as an output transducer. The resonators 7 and transducer-resonators 5 and 6 are all connected to each other by means of mechanical coupling elements 8. The coupling elements 8 are vapor-deposited thin, continuous, wirelike components which are firmly connected to the resonators 7 and transducer-resonators 5 and 6, respectively. By this construction, a multicircuit electromechanical frequency filter is provided and is characteristically capable of extremely sharp frequency selection.

Figure 6:
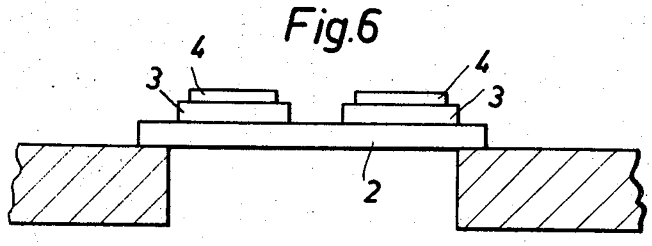
FIG. 6 is a view of a portion of an integrated semiconductor circuit showing still another arrangement having a mechanical resonator according to the present invention.

With regard to the production techniques which are employed to manufacture integrated semiconductor circuits, a further advantage is gained by providing input and output transducers on a single resonator. According to such a construction technique, both transducers are simultaneously disposed on the same surface of the resonator. The material which forms the electrode portion of the transducer is then removed at appropriate places and, if required, the layer of piezoelectric material is also interrupted or reduced in thickness. One example of a mechanical resonator having such a construction is shown in FIG. 6 where corresponding element are indicated by the same reference numerals as used in FIG. 1 through 5.

Even though only resonators excited into flexural vibrations or oscillations have been discussed thus far, which resonators have proven to be particularly free of spurious oscillations, it is within the scope of the present invention to select other types of oscillations or vibrations for the resonators.

Figure 7A:
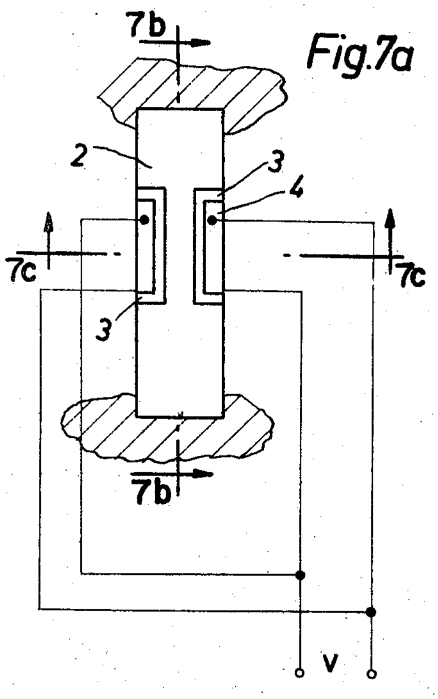
FIG. 7*a* is a plan view of a portion of an integrated semiconductor circuit showing yet another arrangement having a mechanical resonator according to the present invention.
Figure 7B:
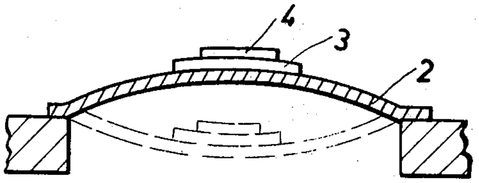
FIG. 7*b* is a cross-sectional view of FIG. 7*a* taken along the line 7*b*–7*b* while the mechanical resonator according to the present invention undergoes flexural vibrations.
Figure 7C:
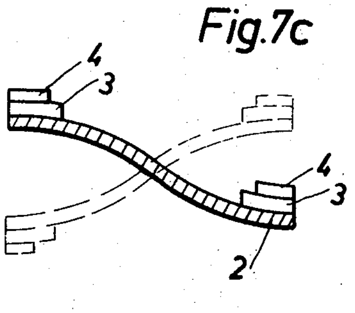
FIG. 7*c* is a cross-sectional view of FIG. 7*a* taken along the line 7*c*–7*c* showing the mechanical resonator according to the present invention undergoing torsional vibrations.

Referring next to FIGS. 7*a* through 7*c*, it will be seen that it is possible without much difficulty to create torsional vibrations within the resonators, according to the present invention. The piezoelectric layer of material is applied on one main surface of the resonator symmetrically with respect to the longitudinal axis thereof. It has been found that cadmium sulfide is a particularly effective piezoelectric material in such a construction. This material is provided with electrodes and is excited into phase-opposed vibrations.

Referring first to FIG. 7*a* , a circuit element 2 is shown which has both its ends firmly anchored in the semiconductor material shown by hatching. A transducer arrangement is provided on each side of the center axis of the element 2. Each such transducer arrangement has a layer 3 of piezoelectric material and an electrode 4. If an excitation voltage V having opposed phase orientation is applied to the transducers thus provided, the element 2 is caused to vibrate torsionally. This phenomenon will be more clearly understood with reference to FIGS. 7*b* and 7 *c*.

Referring to FIG. 7 *b* , resonator 2 is shown which has each of its ends embedded in semiconductor material and which is provided on one surface of the free portion between its ends with a piezoelectric transducer of a piezoelectric layer 3 and an electrode 4. When the piezoelectric layer 3 expands under the influence of a voltage applied by way of the element 2 and the electrode 4, the free portion of element 2, being the resonator, is caused to flex upwardly. This condition of the resonator is illustrated in FIG. 7*b*. When the piezoelectric layer 3 is caused to contract under the influence of an applied voltage of opposite polarity, the element 2 is caused to flex downwardly, as shown by the broken lines in FIG. 7*b*.

Referring next to FIG. 7*c*, if the two transducers on the resonator shown in FIG. 7*a* are excited by a phase-opposed voltage, one-half of the resonator 2 will be caused to move upwardly while the other half of the same resonator will have a tendency to move downwardly. This situation leads to a deformation generally, as shown in FIG. 7*c*. Such deformations correspond to torsional vibrations experienced when AC voltage is applied. The two extreme positions of the deformations of element 2 are illustrated in FIG. 7*c* in solid or broken lines, respectively.

Finally, it should be mentioned that it would be possible to produce the resonators or the filter structures according to the invention separately. This approach is recommended under circumstances where it would be otherwise inadvisable to provide integrated semiconductor circuits for the remaining circuits of an electrical installation.

A typical resonator, according to the present invention, may be formed by vapor deposition of any one of a combination of the following suitable materials: Gold, Nickel-Iron-Alloys, Aluminum, Tantalum, Silver.

In a preferred form the resonator is made of a Nickel-Iron-Alloy which allows a certain degree of temperature stabilization and includes the following dimensions: 0.5 mm. length, 0.2 mm. width, 0.025 mm. thickness. For such a resonator, the natural frequency of oscillation is in the range of about 500 kc./sec.

Moreover, in the transducers-resonators, as depicted in FIGS. 4—7*c*, the piezoelectric layer is usually formed of Cadmium-Sulfid (CdS) and has the following dimensions: 0.4 mm. length, 0.2 mm. width, 0.010 mm. thickness.

The electrode component of the transducer resonators of FIGS. 4—7*c* is preferably formed of Gold or Aluminum and has the following dimensions: 0.3 mm. length, 0.15 mm. width, 0.001 mm. thickness. It will be understood that the above description of the present invention is susceptible to various modificatons, changes and adaptations, and the same are intended to be comprehended within the meaning and range of equivalents of the appended claims.

Especially in connection with FIG. 7*a* it should be emphasized that the electrodes for the application of an excitation voltage V are only for ease of explanation designed as wires. As a matter of fact those electrodes usually will be generated in a vapor-deposition process as are the resonators themselves.

Likewise it should be pointed out that for the purpose of mechanical stability of filter structures according to the invention it may be advantageous to secure the distance of blocks supporting the filter structure by removing the semiconductor material between the blocks not over the full length but only over a distance that is needed for a free oscillation of the resonators.

I claim:

1. An integrated semiconductor circuit comprising: a plurality of semiconductor circuit blocks having their respective circuits electrically interconnected by means of beam leads, said integrated circuit including a mechanical resonator formed by that portion of a beam lead element, which is firmly connected to two of said plurality of circuit blocks, which extends beyond the edges of said two circuit blocks, said mechanical resonator having a layer of piezoelectric material on at least a portion of a first surface thereof, and an electrode member disposed on said layer of piezoelectric material, thus defining a transducer-resonator.

2. An integrated circuit defined in claim 1 wherein the beam lead element forming said mechanical resonator comprises one of said beam leads interconnecting the circuits in said circuit blocks.

3. An integrated semiconductor circuit as defined in claim 1 wherein said mechanical resonators have the characteristic of being excitable by flexural vibrations.

4. An integrated semiconductor circuit as defined in claim 1 wherein said mechanical resonators have the characteristic of being excitable by torsional vibrations.

5. An integrated semiconductor circuit as defined in claim 1 wherein said mechanical resonator has a further layer of piezoelectric material provided on the surface thereof opposite said first surface and an additional electrode member is provided on said further layer of piezoelectric material, thus defining a transducer-resonator having transducers on opposite surfaces of said same mechanical resonator.

6. An integrated semiconductor circuit as defined in claim 1 wherein said mechanical resonator has a further piezoelectric layer provided on said first surface thereof and a further electrode member is provided on said further piezoelectric layer, thus defining a transducer-resonator having at least two transducers provided on the same surface.

7. An integrated semiconductor circuit as defined in claim 1 wherein there are a plurality of said mechanical resonators, two of which are said transducer-resonators and comprise an input and output transducer-resonator, respectively, and a coupling element is provided for connecting the remaining mechanical resonators and said input and output transducer-resonators to one another thereby defining a multicircuit mechanical filter.

8. An integrated semiconductor circuit as defined in claim 7 wherein said coupling element is a thin, continuous, wirelike, structures and are firmly connect to said remaining mechanical resonators and said input and output transducers, respectively.

9. An integrated semiconductor circuit as defined in claim 8 wherein said coupling element is vapor-deposited.